US009523711B2

(12) United States Patent
Yano et al.

(10) Patent No.: US 9,523,711 B2
(45) Date of Patent: Dec. 20, 2016

(54) PROBE APPARATUS AND WAFER MOUNTING TABLE FOR PROBE APPARATUS

(71) Applicant: Tokyo Electron Limited, Tokyo (JP)

(72) Inventors: Kazuya Yano, Nirasaki (JP); Eiji Hayashi, Nirasaki (JP); Munetoshi Nagasaka, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 241 days.

(21) Appl. No.: 14/402,940

(22) PCT Filed: Apr. 25, 2013

(86) PCT No.: PCT/JP2013/062794
§ 371 (c)(1),
(2) Date: Nov. 21, 2014

(87) PCT Pub. No.: WO2013/175954
PCT Pub. Date: Nov. 28, 2013

(65) Prior Publication Data
US 2015/0145547 A1 May 28, 2015

(30) Foreign Application Priority Data

May 23, 2012 (JP) ................................. 2012-117207

(51) Int. Cl.
*G01R 31/00* (2006.01)
*G01R 1/04* (2006.01)
(Continued)

(52) U.S. Cl.
CPC ........... *G01R 1/0425* (2013.01); *G01R 1/0491* (2013.01); *G01R 31/2886* (2013.01); *H01L 21/6838* (2013.01)

(58) Field of Classification Search
CPC .............. G01R 1/0466; G01R 1/07314; G01R 31/2879; G01R 31/2886; G01R 31/2889; G01R 31/2896
See application file for complete search history.

(56) References Cited

U.S. PATENT DOCUMENTS 5,828,225 A * 10/1998 Obikane ............ G01R 31/2886
324/750.25
6,121,783 A * 9/2000 Horner ............... G01R 31/2886
257/E21.531
(Continued)

FOREIGN PATENT DOCUMENTS

JP 01-319964 A 12/1989
JP 07-045692 A 2/1995
(Continued)

OTHER PUBLICATIONS

International Search Report for PCT/JP2013/062794 dated Aug. 6, 2013.

*Primary Examiner* — Tung X Nguyen
(74) *Attorney, Agent, or Firm* — Pearne & Gordon LLP

(57) ABSTRACT

A probe apparatus includes a card clamp unit detachably supporting a probe card; and a wafer mounting table adsorbing the semiconductor wafer and bringing electrodes on the semiconductor wafer into contact with the probes. In order to mount the semiconductor wafer including an annular portion protruding from a rear surface of an outer peripheral portion and a thin portion having a thickness smaller than the annular portion, the wafer mounting table includes a planar portion on which the thin portion is mounted; and a step-shaped portion which is formed at an edge of the planar portion and mounts the annular portion thereon. Multiple circular vacuum chuck grooves are concentrically formed in the planar portion, and at least some of the vacuum chuck grooves are connected to multiple vacuum paths through (Continued)

which vacuum evacuation is performed at multiple positions separated from each other by 90° or more along a circumferential direction.

4 Claims, 3 Drawing Sheets

(51) Int. Cl.
    *H01L 21/683*     (2006.01)
    *G01R 31/28*     (2006.01)

(56) References Cited

U.S. PATENT DOCUMENTS

| | | | |
|---|---|---|---|
| 6,468,098 B1 * | 10/2002 | Eldridge | G01R 1/0735 439/197 |
| 7,112,889 B1 | 9/2006 | Maruyama | |
| 2008/0064184 A1 | 3/2008 | Lackner | |
| 2010/0013169 A1 | 1/2010 | Monteen | |

FOREIGN PATENT DOCUMENTS

| | | |
|---|---|---|
| JP | 2010-080775 A | 4/2010 |
| JP | 2010-098056 A | 4/2010 |

* cited by examiner

PROBE APPARATUS AND WAFER MOUNTING TABLE FOR PROBE APPARATUS

CROSS-REFERENCE TO RELATED APPLICATION

This Application is a U.S. national phase application under 35 U.S.C. §371 of PCT Application No. PCT/JP2013/062794 filed on Apr. 25, 2013, which claims the benefit of Japanese Patent Application No. 2012-117207 filed on May 23, 2012, the entire disclosures of which are incorporated herein by reference.

TECHNICAL FIELD

The embodiments described herein pertain generally to a probe apparatus and a wafer mounting table for probe apparatus.

BACKGROUND

In a semiconductor device manufacturing process, there has been used a probe apparatus configured to perform an electrical inspection on a semiconductor device formed on a semiconductor wafer. In such a probe apparatus, there has been used a probe card in which multiple probes in contact with multiple electrode pads on the semiconductor wafer are provided.

Further, this probe card is provided at a card clamp device of the probe apparatus, and the semiconductor wafer is adsorbed and held on a wafer mounting table, and the wafer mounting table is moved by a driving device. Thus, electric conductance can be obtained by bringing the probes of the probe card into contact with the electrodes of the target semiconductor device on the semiconductor wafer. Then, an electrical inspection is carried out to the target semiconductor device by supplying an inspection signal to the target semiconductor device from a tester via the probes and by measuring signals from the target semiconductor device (see, for example, Patent Document 1).

The wafer mounting table of the probe apparatus adsorbs and holds the semiconductor wafer with a vacuum chuck. For this reason, on a mounting surface of the wafer mounting table, for example, multiple circular vacuum chuck grooves are concentrically formed with equal spaces therebetween. Further, the semiconductor wafer is adsorbed on the mounting surface by evacuation through a vacuum path connected to these vacuum chuck grooves.

Recently, a semiconductor wafer has been thinned, and in order to make it easy to handle such a thinned semiconductor wafer, there has been used a so-called "Taiko wafer" including an annular portion which has a larger thickness and is formed at an outer peripheral portion on a rear surface thereof and the other thin portion having a thickness smaller than that of the annular portion (see, for example, Patent Document 2). Such a semiconductor wafer including the annular portion having a large thickness and the thin portion having a small thickness is likely to be bent since the stiffness of the thin portion is low as compared with the typical semiconductor wafers, and the annular portion and the thin portion are remarkably different from each other in the stiffness. For this reason, if such a semiconductor wafer is mounted on a wafer mounting table of a probe apparatus to be adsorbed and held thereon, it is difficult to uniformly adsorb the entire semiconductor wafer unlike a case of adsorbing and holding the typical semiconductor wafer.

REFERENCES

Patent Document 1: Japanese Patent Laid-open Publication No. 2010-080775
Patent Document 2: Japanese Patent Laid-open Publication No. 2010-098056

DISCLOSURE OF THE INVENTION

Problems to be Solved by the Invention

As described above, in a conventional probe apparatus, when a semiconductor wafer including an annular portion having a large thickness and a thin portion having a small thickness is adsorbed and held on a wafer mounting table, it is difficult to uniformly adsorb the entire semiconductor wafer.

In view of the foregoing, example embodiments provide a wafer mounting table for probe apparatus and a probe apparatus capable of uniformly adsorbing and holding a semiconductor wafer including an annular portion having a large thickness and a thin portion having a small thickness.

Means for Solving the Problems

In one example embodiment, a probe apparatus includes a card clamp unit configured to detachably support a probe card including multiple probes; and a wafer mounting table, having a driving unit, configured to adsorb and hold a semiconductor wafer and configured to bring electrodes formed on the semiconductor wafer into contact with the multiple probes of the probe card supported on the card clamp unit by operating the driving unit. In order to mount the semiconductor wafer including an annular portion protruding from a rear surface of an outer peripheral portion thereof and a thin portion, as the other portion than the annular portion, having a thickness smaller than that of the annular portion, the wafer mounting table further includes a planar portion on which the thin portion is mounted and a step-shaped portion which is formed at an edge portion of the planar portion and mounts the annular portion thereon. Further, multiple circular vacuum chuck grooves are concentrically formed in the planar portion, and the multiple vacuum chuck grooves are connected to a first vacuum path, a second vacuum path, and a third vacuum path through which vacuum evacuation is performed at multiple positions. In the multiple vacuum chuck grooves, the vacuum chuck grooves at an inner periphery side thereof are connected to the first vacuum path, and the vacuum chuck grooves at an outer periphery side thereof are connected to the second vacuum path and the third vacuum path. Furthermore, the first vacuum path and the second vacuum path are arranged to be adjacent to each other, and the second vacuum path and the third vacuum path are arranged to be separated from each other by 90° or more along a circumferential direction thereof. Further, in the multiple vacuum chuck grooves, a distance between three adjacent vacuum chuck grooves formed at the outermost periphery portion thereof is shorter than a distance between the other adjacent vacuum chuck grooves.

In another example embodiment, there is provided a wafer mounting table for a probe apparatus. The wafer mounting table is configured to adsorb and hold a semiconductor wafer and includes a driving unit. The wafer mounting table is also configured to bring electrodes formed on the semiconductor wafer into contact with probes of a probe card by operating the driving unit. In order to mount the semiconductor wafer including an annular portion protruding from a rear surface of an outer peripheral portion thereof and a thin portion, as the other portion than the annular portion, having a thickness smaller than that of the annular portion, the wafer mounting table further includes a planar portion on which the thin portion is mounted and a step-shaped portion which is formed at an edge portion of the planar portion and mounts the annular portion thereon. Further, multiple circular vacuum chuck grooves are concentrically formed in the planar portion, and the multiple vacuum chuck grooves are connected to a first vacuum path, a second vacuum path, and a third vacuum path through which vacuum evacuation is performed at multiple positions. In the multiple vacuum chuck grooves, the vacuum chuck grooves at an inner periphery side thereof are connected to the first vacuum path, and the vacuum chuck grooves at an outer periphery side thereof are connected to the second vacuum path and the third vacuum path. Furthermore, the first vacuum path and the second vacuum path are arranged to be adjacent to each other, and the second vacuum path and the third vacuum path are arranged to be separated from each other by 90° or more along a circumferential direction thereof. Further, in the multiple vacuum chuck grooves, a distance between three adjacent vacuum chuck grooves formed at the outermost periphery portion thereof is shorter than a distance between the other adjacent vacuum chuck grooves.

Effect of the Invention

In accordance with the example embodiments, it is possible to uniformly adsorb and hold a semiconductor wafer including an annular portion having a large thickness and a thin portion having a small thickness.

MODE FOR CARRYING OUT THE INVENTION

Hereinafter, an example embodiment will be explained with reference to the accompanying drawings.

Figure 1:
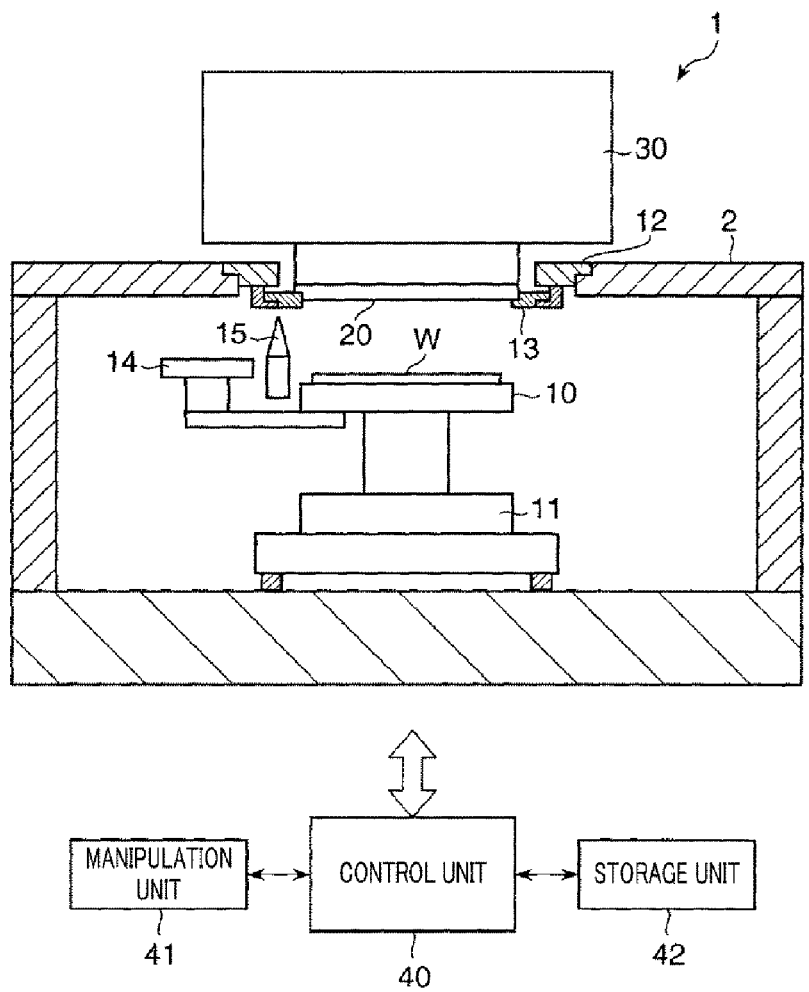
FIG. 1 is a schematic diagram illustrating a configuration of a probe apparatus in accordance with an example embodiment.

Firstly, a configuration of a probe apparatus configured to perform an inspection on a semiconductor device formed on a semiconductor wafer will be explained with reference to FIG. 1. As depicted in FIG. 1, a probe apparatus 1 includes a housing 2, and within the housing 2, a wafer mounting table 10 configured to mount, adsorb, and hold a semiconductor wafer W is provided. The wafer mounting table 10 includes a driving unit 11 and can be moved in x, y, z, and θ directions by the driving unit 11.

At a portion of the housing 2 positioned above the wafer mounting table 10, a circular opening is formed. An insert ring 12 is provided along a periphery of the circular opening.

The insert ring 12 is provided with a card clamp unit 13, and the card clamp unit 13 is configured to detachably support a probe card 20.

The probe card 20 includes a circuit board and multiple probes (not illustrated) electrically connected to the circuit board. The probes of the probe card 20 are provided corresponding to electrodes of the semiconductor device formed on the semiconductor wafer W.

Further, at a side of the wafer mounting table 10, a needle grinder 14 configured to grind front ends of the probes and a camera 15 provided upwardly and capable of capturing an image of an upper area thereof are provided. The camera 15 is formed of, for example, a CCD camera or the like and configured to capture images of the probes of the probe card 20 to perform a position-alignment with the probes.

Further, above the probe card 20, there is provided a tester head 30 connected to a tester that inspects a status of the semiconductor device by sending a signal for the inspection and measuring a signal from the semiconductor device.

Figure 2:
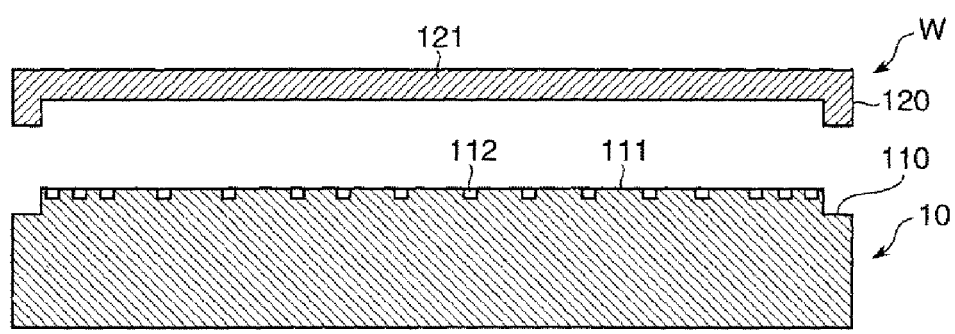
FIG. 2 is a longitudinal cross-sectional view of a wafer mounting table of the probe apparatus of FIG. 1.

In the present example embodiment, as depicted in FIG. 2, the semiconductor wafer W to which the electrical inspection is carried out in the probe apparatus 1 is a so-called Taiko wafer including an annular portion 120 protruding from a rear surface of an outer peripheral portion thereof and a thin portion 121, as the other portion than the annular portion 120, having a thickness smaller than that of the annular portion 120.

In this case, the thin portion 121 has a thickness of, for example, about 100 μmm or less (for example, 40 μm), and is much thinner than the typical semiconductor wafer (for example, a thickness of 700 μmm). Therefore, the thin portion 121 is likely to be deformed due to a low stiffness. Further, the annular portion 120 has a large thickness to have a high stiffness. Since the annular portion 120 is formed, overall deformation of the semiconductor wafer W can be suppressed and the semiconductor wafer W can be easily handled. Further, such a semiconductor wafer W is manufactured by, for example, grinding an inner portion of the annular portion 120 without grinding the annular portion 120.

In order for the wafer mounting table 10 to mount the semiconductor wafer W configured as described above thereon, a mounting surface of the wafer mounting table 10 includes a planar portion 111 on which the thin portion 121 is mounted and a step-shaped portion 110 which is formed at an outer peripheral portion of the planar portion 111 and has a downward step to mount the annular portion 120 thereon, as depicted in FIG. 2.

Figure 3:
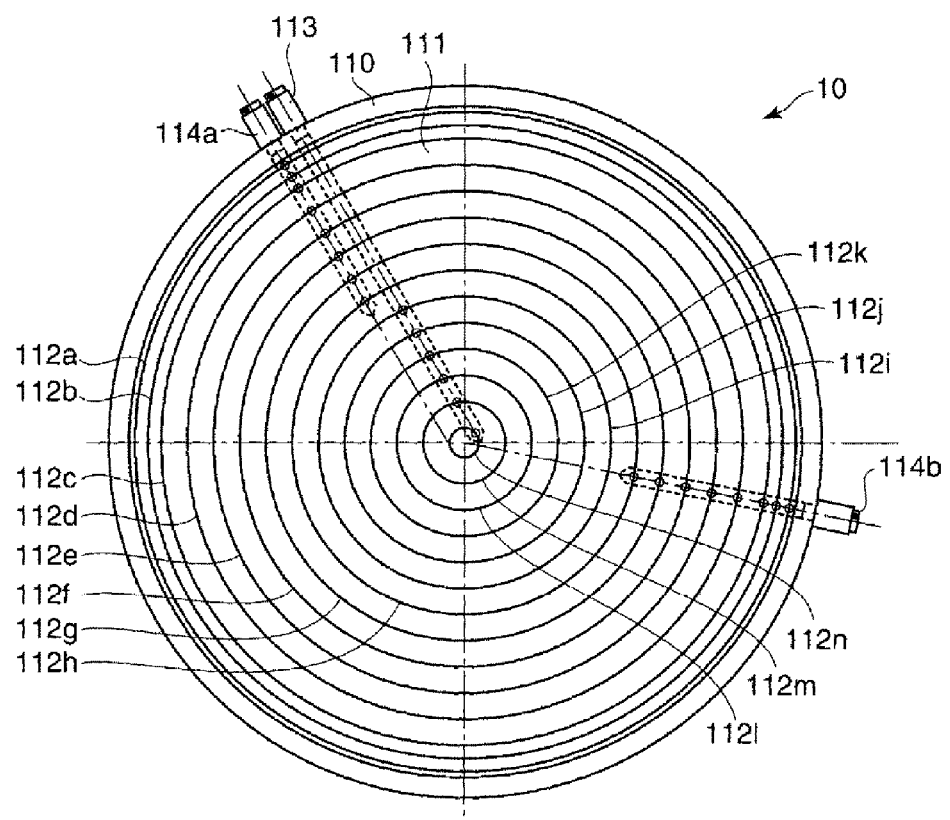
FIG. 3 is a top view of the wafer mounting table of the probe apparatus of FIG. 1.

Further, as depicted in FIG. 3, the planar portion 111 of the wafer mounting table 10 includes multiple circular vacuum chuck grooves 112 (112a to 112n) which are concentrically formed. The vacuum chuck grooves 112 (112a to 112n) are formed with equal spaces from the innermost vacuum chuck groove 112n to the outside. Gaps (distance) between the outermost vacuum chuck groove 112a and the second outermost vacuum chuck groove 112b, and between the second outermost vacuum chuck groove 112b and the third outermost vacuum chuck groove 112c are formed to be half the gap between the other vacuum chuck grooves 112 (112c to 112n).

Furthermore, in the present example embodiment, the three vacuum chuck grooves 112a, 112b, and 112c formed at the outer peripheral portion are arranged with the smaller gap (distance) therebetween than the gap between the other vacuum chuck grooves 112. However, at least the two vacuum chuck grooves 112a and 112b formed at the outermost peripheral portion may be arranged with a gap (distance) therebetween to be closer to each other than the other portion.

Among the vacuum chuck grooves 112a to 112n, the vacuum chuck grooves 112i to 112n positioned at an inner peripheral portion are connected to a vacuum line 113 serving as a vacuum path. Further, the vacuum chuck grooves 112a to 112h positioned at the outer peripheral portion are connected to two vacuum lines 114a and 114b serving as vacuum paths. Furthermore, the two vacuum lines 114a and 114b are arranged to be separated from each other by 90° or more (to be separated from each other by about 130° in the present example embodiment) along a circumferential direction of the wafer mounting table 10. Herein, the two vacuum lines 114a and 114b are arranged to be separated from each other by 90° or more along the circumferential direction thereof in order to avoid reduction in adsorptive force on the semiconductor wafer W at a position away from the vacuum lines. Therefore, the two vacuum lines 114a and 114b are arranged to be separated from each other by desirably 120° or more, and more desirably, 180°.

In the present example embodiment, the two vacuum lines 114a and 114b are arranged as described above. However, three or more vacuum lines may be arranged. If three vacuum lines are arranged, desirably, they may be arranged to be separated from one another by 120° along the circumferential direction thereof. If four vacuum lines are arranged, desirably, they may be arranged to be separated from one another by 90° along the circumferential direction thereof.

Further, in the present example embodiment, the vacuum line 113 connected to the vacuum chuck grooves 112i to 112n positioned at the inner peripheral portion and the vacuum lines 114a and 114b connected to the vacuum chuck grooves 112a to 112h positioned at the outer peripheral portion are separately arranged. However, for example, the vacuum lines 114a and 114b may also be connected to the vacuum chuck grooves 112i to 112n positioned at the inner peripheral portion without providing the vacuum line 113.

In the wafer mounting table 10 configured as described above, it is possible to uniformly adsorb and hold the semiconductor wafer W as the so-called Taiko wafer including the annular portion 120 having a large thickness and the thin portion 121 having a small thickness.

Figure 4:
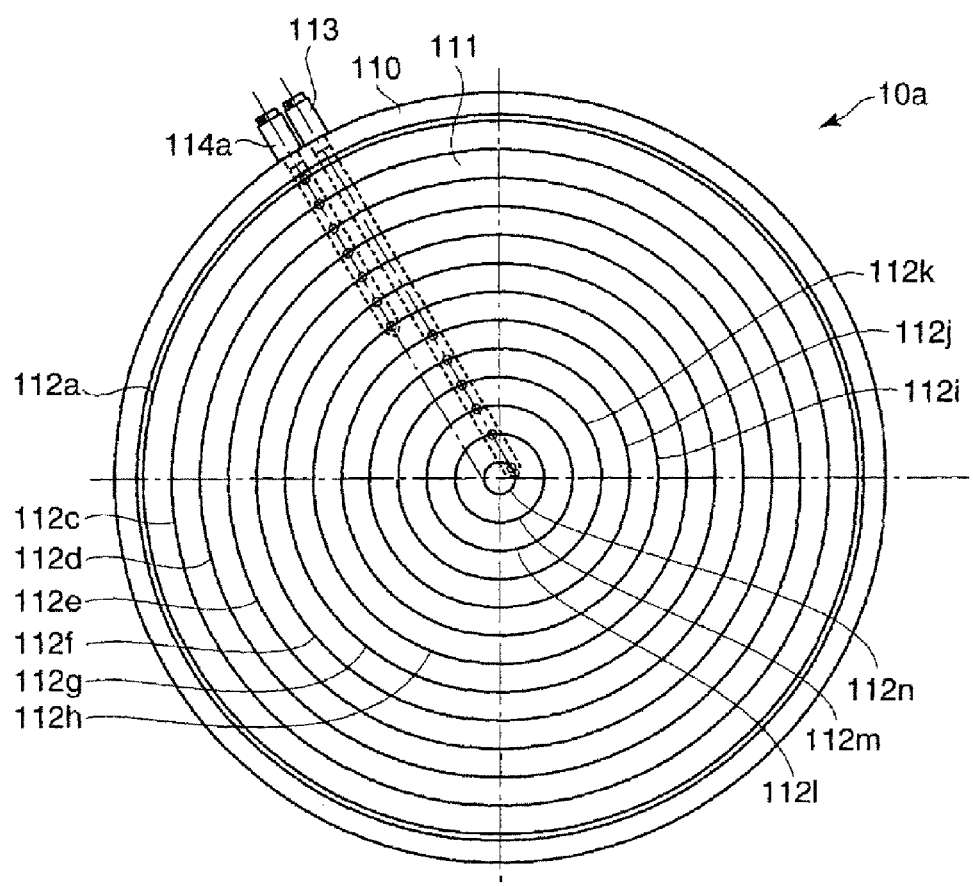
FIG. 4 is a top view of a wafer mounting table of a probe apparatus in accordance with a comparative example.

Herein, for example, as depicted in FIG. 4, all of the vacuum chuck grooves 112 in a wafer mounting table 10a have the same space therebetween, and the wafer mounting table 10a does not include the second outermost vacuum chuck groove 112b and the vacuum line 114b as compared with FIG. 3. The wafer mounting table 10a cannot uniformly adsorb and hold the so-called Taiko wafer including the annular portion 120 having a large thickness and the thin portion 121 having a small thickness.

That is, although the thin portion 121 has the same thickness, an edge portion of the thin portion 121 near the annular portion 120 has a higher stiffness due to the annular portion 120. Meanwhile, a central portion of the thin portion 121 is away from the annular portion 120 having a higher stiffness to have a lower stiffness than that of the edge portion. For this reason, when the evacuation through the vacuum lines 113 and 114a is started, the central portion of the thin portion 121 is first adsorbed on the wafer mounting table 10a, and then, the edge portion of the thin portion 121 is adsorbed to the wafer mounting table 10a in sequence from the vicinity of the vacuum line 114a toward its both sides along the circumferential direction thereof. Then, a portion away from the vacuum line 114a by 180° is adsorbed on the wafer mounting table 10a. Thus, it is possible to observe that this portion has a weak adsorptive force on the semiconductor wafer W as compared with the other portion.

Further, since the thin portion 121 has a small thickness and the vacuum chuck grooves 112 can be seen from a surface side of the semiconductor wafer W, strength of adsorptive force on the semiconductor wafer W can be observed. That is, the vacuum chuck grooves 112 can be clearly seen from a portion having a strong adsorptive force but the vacuum chuck grooves 112 cannot be clearly seen from a portion having a weak adsorptive force.

A reason why an adsorptive force at the portion away from the vacuum line 114a by 180° becomes weak is because this portion is located at the farthermost position from the vacuum line 114a, and also because deformation of the thin portion 121 is concentrated on this portion when this portion is lastly adsorbed. Further, in the wafer mounting table 10a having a configuration as depicted in FIG. 4, it can be seen that an adsorptive force on the semiconductor wafer W is weak at the outer peripheral portion as compared with the inner peripheral portion. This is because the outer peripheral portion has a relatively high stiffness as compared with the inner peripheral portion.

As described above, if the semiconductor wafer W is not uniformly adsorbed on the wafer mounting table 10a, when the probes are brought into contact with the electrodes of the semiconductor wafer W adsorbed and held on the wafer mounting table 10a, contact pressures of the probes become non-uniform.

In this regard, in the wafer mounting table 10 in accordance with the present example embodiment depicted in FIG. 3, the vacuum chuck grooves 112a to 112h positioned at the outer peripheral portion are connected to the two vacuum lines 114a and 114b serving as the vacuum paths to be separated from each other by 90° or more (positions away from each other by about) 130° along the circumferential direction. Thus, there is no portion having a weak adsorptive force with respect to the semiconductor wafer W, which is caused when the vacuum chuck grooves are separated from the vacuum lines. Further, when the adsorption is started, the adsorption of the semiconductor wafer W at the outer peripheral portion of the wafer mounting table 10 progresses from the vicinity of the vacuum line 114a and the vicinity of the vacuum line 114b toward their both sides along the circumferential direction. Therefore, deformation of the thin portion 121 is distributed without being concentrated on a single portion. As a result, the entire semiconductor wafer W is uniformly adsorbed on the wafer mounting table 10.

Further, in the wafer mounting table 10, the gaps between the outermost vacuum chuck groove 112a and the second outermost vacuum chuck groove 112b, and between the second outermost vacuum chuck groove 112b and the third outermost vacuum chuck groove 112c are formed to be half the gap between the other vacuum chuck grooves 112. Therefore, an adsorptive with respect to the semiconductor wafer W at the outer peripheral portion of the wafer mounting table 10 is increased and it is possible to suppress the adsorptive force on the outer peripheral portion from being weaker than that on the inner peripheral portion. Therefore, it is possible to uniformly adsorb the entire semiconductor wafer W on the wafer mounting table 10.

As depicted in FIG. 1, an operation of the probe apparatus 1 configured as described above is generally controlled by a control unit 40 including a CPU or the like. The control unit 40 includes a manipulation unit 41 and a storage unit 42.

The manipulation unit 41 is formed of a keyboard by which a process manager inputs a command to manage the probe apparatus 1, a display that visibly displays an operation status of the probe apparatus 1, and the like.

The storage unit 42 is configured to store a recipe in which various processes are executed in the probe apparatus by a control program (software) under the control of the control unit 40 or inspection condition data. Then, if necessary, various processes are performed in the probe apparatus 1 under the control of the control unit 40 by retrieving a certain recipe from the storage unit 42 in response to an instruction or the like from the manipulation unit 41 and executing the recipe in the control unit 40. Further, the recipe of the processing condition data or the control program may be stored in a computer-readable storage medium (for example, a hard disc, a CD, a flexible disc, a semiconductor memory, or the like), or may be transmitted at any time through, for example, a dedicated line from another device and used online.

When an electrical inspection is carried out to the semiconductor device formed on the semiconductor wafer W by using the probe apparatus 1 configured as described above, the semiconductor wafer W is mounted on the wafer mounting table 10 to be adsorbed and held thereon. Then, the semiconductor wafer W is moved by the wafer mounting table 10, and electric conductance can be obtained by bringing the electrodes of the semiconductor wafer W into contact with the respectively corresponding probes of the probe card 20. Thus, the tester connected to the tester head 30 checks the quality of the electrical characteristics of the semiconductor device.

Although the example embodiment has been explained above, the present disclosure is not limited to the above-described example embodiment and can be modified and changed in various ways.

The present patent application claims the benefit of priority to Japanese Patent Application No. 2012-117207 filed on May 23, 2012, the disclosures of which are incorporated herein by reference.

EXPLANATION OF REFERENCE NUMERALS

1: Probe apparatus
2: Housing
10: Wafer mounting table
11: Driving unit
12: Insert ring
13: Card clamp unit
14: Needle grinder
15: Camera
20: Probe card
30: Test head
40: Control unit
41: Manipulation unit
42: Storage unit

We claim:

1. A probe apparatus comprising:
a card clamp unit configured to detachably support a probe card including multiple probes; and
a wafer mounting table, having a driving unit, configured to adsorb and hold a semiconductor wafer and configured to bring electrodes formed on the semiconductor wafer into contact with the multiple probes of the probe card supported on the card clamp unit by operating the driving unit,
wherein, in order to mount the semiconductor wafer including an annular portion protruding from a rear surface of an outer peripheral portion thereof and a thin portion, as the other portion than the annular portion, having a thickness smaller than that of the annular portion, the wafer mounting table further includes a planar portion on which the thin portion is mounted and a step-shaped portion which is formed at an edge portion of the planar portion and mounts the annular portion thereon,
multiple circular vacuum chuck grooves are concentrically formed in the planar portion, and the multiple vacuum chuck grooves are connected to a first vacuum path, a second vacuum path, and a third vacuum path through which vacuum evacuation is performed at multiple positions,
in the multiple vacuum chuck grooves, the vacuum chuck grooves at an inner periphery side thereof are connected to the first vacuum path, and the vacuum chuck grooves at an outer periphery side thereof are connected to the second vacuum path and the third vacuum path,
the first vacuum path and the second vacuum path are arranged to be adjacent to each other,
the second vacuum path and the third vacuum path are arranged to be separated from each other by 90° or more along a circumferential direction thereof, and
in the multiple vacuum chuck grooves, a distance between three adjacent vacuum chuck grooves formed at the outermost periphery portion thereof is shorter than a distance between the other adjacent vacuum chuck grooves.

2. A wafer mounting table for a probe apparatus,
wherein the wafer mounting table is configured to adsorb and hold a semiconductor wafer and includes a driving unit,
the wafer mounting table is configured to bring electrodes formed on the semiconductor wafer into contact with probes of a probe card by operating the driving unit,
in order to mount the semiconductor wafer including an annular portion protruding from a rear surface of an outer peripheral portion thereof and a thin portion, as the other portion than the annular portion, having a thickness smaller than that of the annular portion, the wafer mounting table further includes a planar portion on which the thin portion is mounted and a step-shaped portion which is formed at an edge portion of the planar portion and mounts the annular portion thereon,
multiple circular vacuum chuck grooves are concentrically formed in the planar portion, and the multiple vacuum chuck grooves are connected to a first vacuum path, a second vacuum path, and a third vacuum path through which vacuum evacuation is performed at multiple positions,
in the multiple vacuum chuck grooves, the vacuum chuck grooves at an inner periphery side thereof are connected to the first vacuum path, and the vacuum chuck grooves at an outer periphery side thereof are connected to the second vacuum path and the third vacuum path,
the first vacuum path and the second vacuum path are arranged to be adjacent to each other,
the second vacuum path and the third vacuum path are arranged to be separated from each other by 90° or more along a circumferential direction thereof, and
in the multiple vacuum chuck grooves, a distance between three adjacent vacuum chuck grooves formed at the outermost periphery portion thereof is shorter than a distance between the other adjacent vacuum chuck grooves.

3. The probe apparatus of claim 1,
wherein the distance between the three adjacent vacuum chuck grooves formed at the outermost periphery portion thereof is one half of the distance between the other adjacent vacuum chuck grooves.

4. The wafer mounting table of claim 2,
wherein the distance between the three adjacent vacuum chuck grooves formed at the outermost periphery portion thereof is one half of the distance between the other adjacent vacuum chuck grooves.

\* \* \* \* \*